United States Patent
Cheah et al.

(10) Patent No.: US 12,500,175 B2
(45) Date of Patent: Dec. 16, 2025

(54) INTEGRATED BRIDGE FRAME FOR PACKAGE SUBSTRATE

(71) Applicant: Intel Corporation, Santa Clara, CA (US)

(72) Inventors: Bok Eng Cheah, Pulau Pinang (MY); Seok Ling Lim, Kulim Kedah (MY); Jenny Shio Yin Ong, Pulau Pinang (MY); Jackson Chung Peng Kong, Pulau Pinang (MY); Kooi Chi Ooi, Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 949 days.

(21) Appl. No.: 17/411,062

(22) Filed: Aug. 25, 2021

(65) Prior Publication Data

US 2023/0065380 A1   Mar. 2, 2023

(51) Int. Cl.
  *H01L 23/538* (2006.01)
  *H01L 21/48* (2006.01)
  *H01L 23/00* (2006.01)
  *H01L 23/498* (2006.01)
  *H01L 25/00* (2006.01)
  *H01L 25/065* (2023.01)

(52) U.S. Cl.
  CPC ...... *H01L 23/5383* (2013.01); *H01L 21/4857* (2013.01); *H01L 21/486* (2013.01); *H01L 23/49816* (2013.01); *H01L 23/5384* (2013.01); *H01L 24/16* (2013.01); *H01L 24/17* (2013.01); *H01L 24/81* (2013.01); *H01L 25/0652* (2013.01); *H01L 25/50* (2013.01); *H01L 2224/1703* (2013.01)

(58) Field of Classification Search
  CPC ...... H01L 23/498–49894; H01L 23/538–5389
  See application file for complete search history.

(56) References Cited

U.S. PATENT DOCUMENTS

| | | | |
|---|---|---|---|
| 2007/0000688 A1* | 1/2007 | Mobley | H01L 21/4857 29/846 |
| 2019/0304912 A1* | 10/2019 | Ecton | H01L 23/5386 |
| 2019/0385977 A1* | 12/2019 | Elsherbini | H01L 23/5389 |
| 2020/0152608 A1* | 5/2020 | Hu | H01L 24/20 |
| 2021/0057352 A1* | 2/2021 | Agarwal | H01L 21/4857 |
| 2021/0098421 A1* | 4/2021 | Wu | H01L 23/49811 |
| 2021/0384130 A1* | 12/2021 | Cheah | H01L 24/17 |

* cited by examiner

Primary Examiner — Kevin Parendo
(74) Attorney, Agent, or Firm — Viering, Jentschura & Partner mbB

(57) ABSTRACT

The present disclosure is directed to multichip semiconductor packages, and methods for making them, which includes a package substrate with an integrated bridge frame having a first horizontal portion positioned on a top surface of the package substrate, with first and second dies positioned overlapping the first horizontal portion of the bridge frame, and a second horizontal portion positioned on the bottom surface of the package substrate, with third and fourth dies positioned overlapping the second horizontal portion of the bridge frame. The bridge frame further includes first and second vertical portions separated by a portion of the package substrate positioned under the first horizontal portion of the bridge frame between the top surface and bottom surfaces of the package substrate, and a plurality of vertical interconnects adjacent to the first and second vertical portions of the bridge frame.

19 Claims, 9 Drawing Sheets

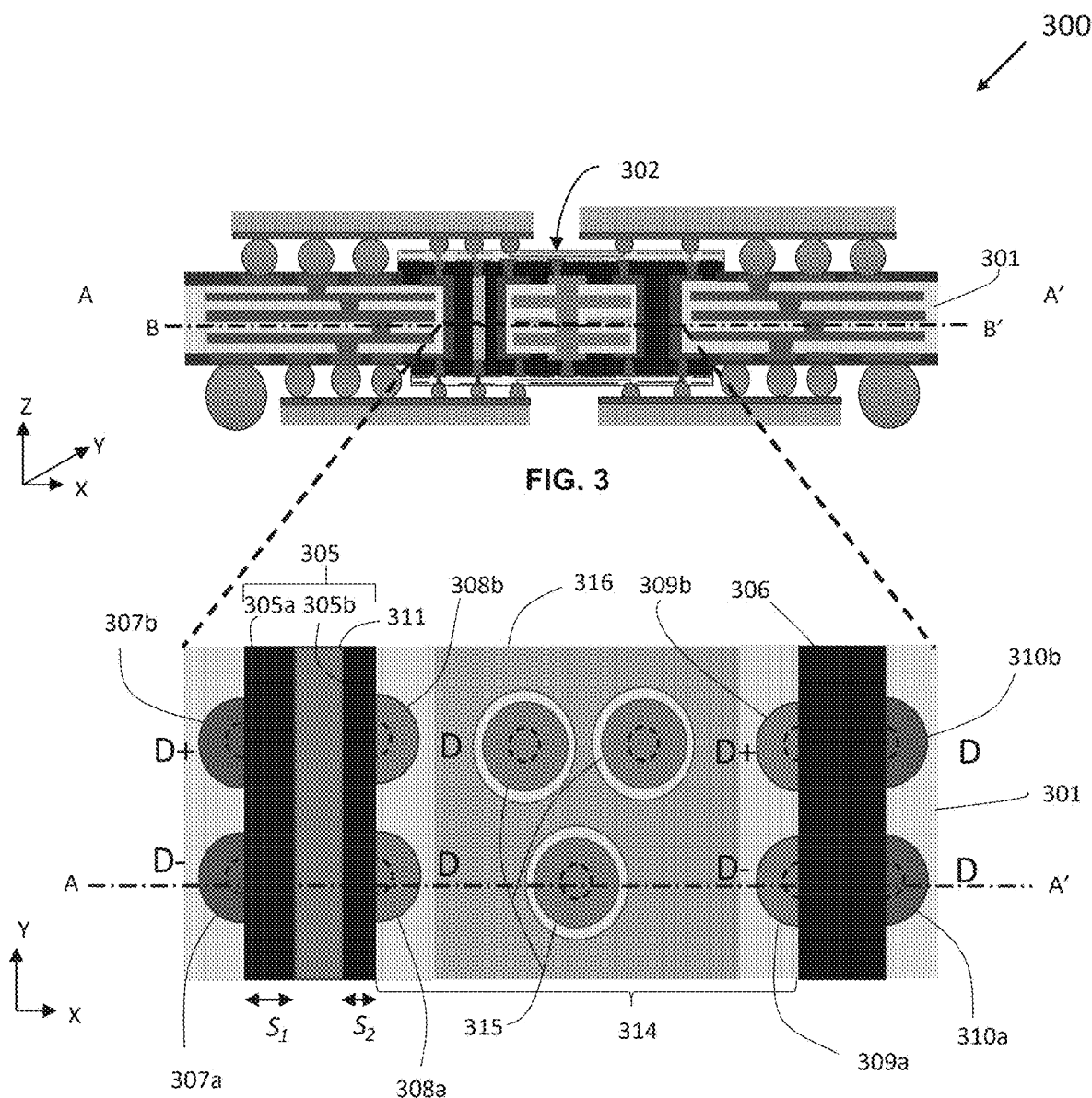

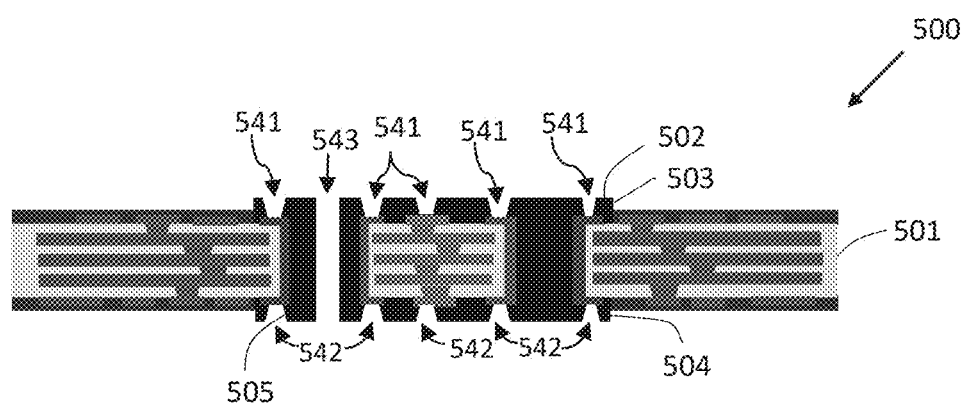
FIG. 5D
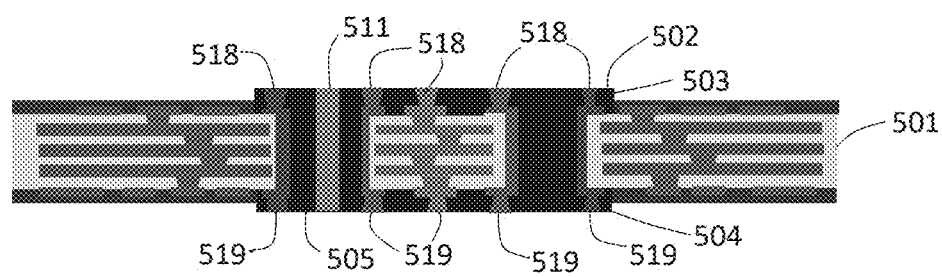
FIG. 5E
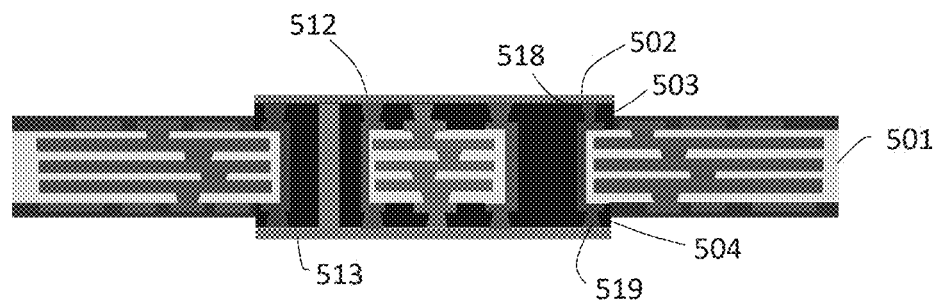
FIG. 5F

INTEGRATED BRIDGE FRAME FOR PACKAGE SUBSTRATE

BACKGROUND

For multi-chip packages, as scaling continues further into the submicron regime, the interconnect design, their electrical properties and reliability, have increasingly gained importance. Conventional interconnect designs have signals propagating through extensive transmission lines across the package substrate to a printed circuit board (PCB) and through multiple interconnect transitions, e.g., vertical vias, capacitive solder balls, sockets, and/or plated-through-hole (PTH) structures. An important consequence of scaling transistor and interconnect dimensions, as well as increasing chip sizes, is that the major source for signal propagation delay (i.e., signal latency) has shifted from the active transistors to the passive interconnect lines, including for chip-to-chip interconnections.

To enable greater miniaturization, conventional packaging technology uses die stacking to incorporate two or more dies or chiplets into a vertical assembly to reduce their overall footprint. Such designs can increase signal impairments, e.g., channel impedance discontinuities along the vertical transitions due to their die stacking hierarchy. It is also known that interconnect placement and wire sizing may have a significant impact on the signal delay from interconnects, and the performance of circuits, especially in deep submicron or nanometer designs that can have significant wire resistance.

Current approaches for reduced signal latency include the mounting of dynamic random access memory (DRAM) packages near the central processing unit (CPU) or graphical processing unit (GPU) package to reduce the interconnect trace length. However, the stacking of DRAM packages on the top side of a system on a chip (SOC) package will require package real-estate and/or package layer count (i.e., z-height) trade-offs due to placement of the DRAM packages adjacent to the SOC die(s) and the required footprint for the DRAM signal breakout.

Alternatively, the use of high-density device integration (i.e., 2.5D and/or 3D integrated circuit packaging) may also be used to reduce signal latency between a CPU/GPU and their associated memory devices (e.g., a DRAM memory). The use of 2.5D and 3D architecture may permit multiple dies to be positioned inside the same package using an interposer or substrate, which may be a chip or multi-layered structure with through-silicon vias (TSVs) for communication, and/or an embedded bridge interconnects placed within the package substrate.

However, the disadvantages of a silicon interposer may include increased package z-height from adding to package layer count and/or real estate trade-off and signal integrity impairments due to high-resistive TSV structures for device interconnects. For embedded bridge interconnects, there may be a power integrity trade-off due to extensive inductance loop ascribed to power delivery network (PDN) discontinuities, e.g., lateral and/or vertical power plane interconnects obstructions due to having an embedded component within the package substrate. Therefore, 2.5D and/or 3D packaging solutions should seek to avoid increasing power loop inductance, the higher resistance in the TSV interconnects, and package form-factor expansion, which is a present challenge to be considered and overcome.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 1A shows an expanded view of an area of the semiconductor package shown in FIG. 1;

FIG. 3 shows a vertical cross-section view along the A-A' line of a semiconductor package having a package substrate with an integrated bridge frame according to an aspect of the present disclosure;

FIG. 3A shows a horizontal cross-section view along the B-B' line of the semiconductor package shown in FIG. 3;

FIGS. 5A through 5I show vertical cross-sectional views directed to an exemplary process flow for making a semiconductor package having a package substrate with an integrated bridge frame according to aspects of the present disclosure;

DETAILED DESCRIPTION

Figure 1:
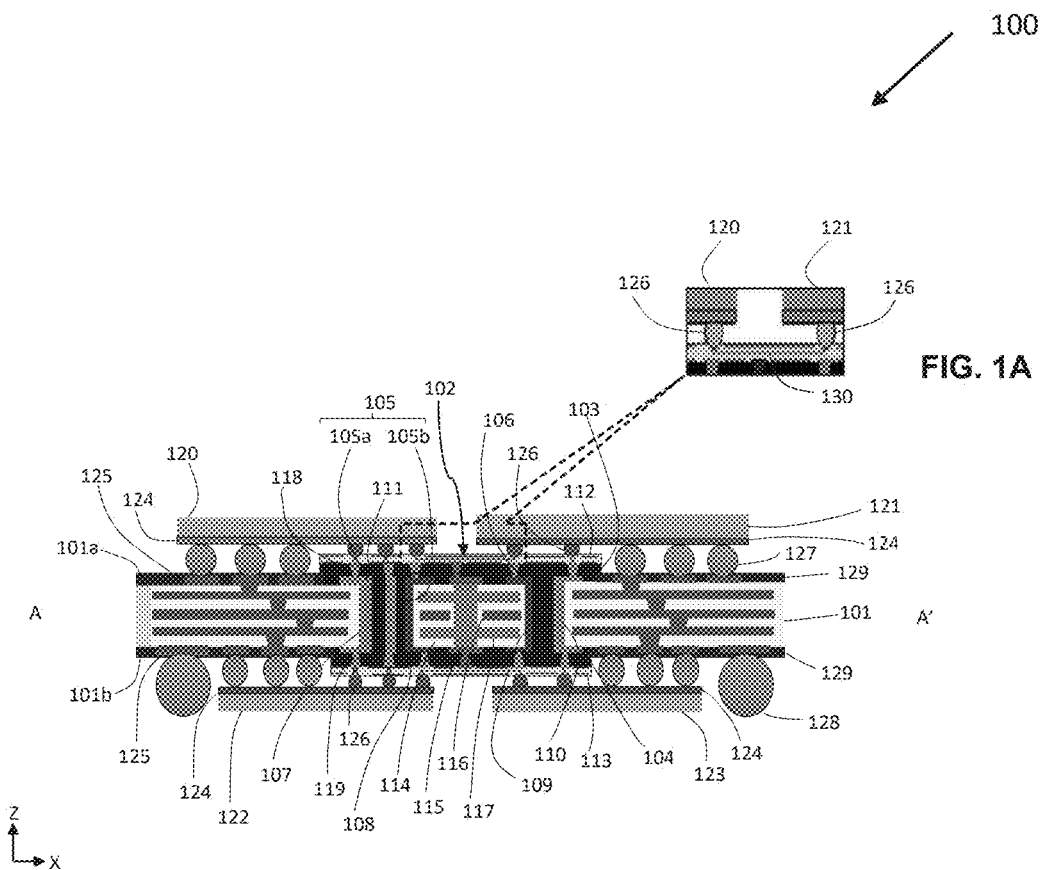
FIG. 1 shows a vertical cross-section view along the A-A' line of a semiconductor package having a package substrate with an integrated bridge frame according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to semiconductor packages that include package substrates with integrated bridge frames having "omni-directional" connections (i.e., in the x, y, and z directions) between one or more first silicon dies or devices (e.g., a CPU, GPU, platform controller hub chipset, and/or other processor devices) and one or more second silicon dies or device (e.g., a DRAM and/or other memory devices) that minimizes signal latency, as well as including other components (e.g., passive devices). In addition, it should be understood the first silicon device and the second silicon device, respectively, may include one or more semiconductor dies/chips mounted on top and bottom surfaces of the package substrate and the bridge frame.

In an aspect, the semiconductor package may include a package substrate with a top surface and a bottom surface having a plurality of plated through-hole (PTH) vias that may be combined with an integrated bridge frame, which together may be considered a "composite" or "hybrid" substrate, unlike a conventional laminate package substrate. In this aspect, the bridge frame includes a molded first horizontal portion positioned on the top surface of the package substrate and a molded second horizontal portion positioned at the bottom surface of the package substrate directly under the first horizontal portion of the bridge frame, and one or more molded vertical portions positioned therebetween that may be built into the package substrate.

In yet another aspect, the present vertical portions of the bridge frame may be formed adjacent to a plurality of vertical interconnects, which provide electrical connections between semiconductor components placed at the top and bottom surfaces of the package substrate that may minimize signal latency. In an aspect, the electrical connections may be a direct signal connection. The plurality of vertical interconnects vias may be considered elements of the bridge frame that provide, in part, the omni-directional interconnect capability of the present bridge frames.

In a further aspect, the present semiconductor package may include the first and second horizontal portions of the bridge frame having first and second redistribution layers, respectively, thereon to provide electrical connections between devices on the top and bottom surfaces of the package substrate. The first and second redistribution layers may be considered elements of the bridge frame that provide, in part, the omni-directional interconnect capability of the present bridge frames.

In another aspect, the term "frame" as used in reference to the present bridge frames should be understood as being structures that may be an integrated portion of a package substrate positioned on or overlay the surfaces of the package substrate (i.e., the horizontal portions) that span the surfaces, as well as being structures that connect these surface structures (i.e., the vertical portions), which together provide the omni-directional interconnects or bridges between various components on the package substrate according to the present disclosure. In the various aspects of the bridge frames, the horizontal portions may be separated into segments (e.g., as shown in FIG. 2B) and the vertical portions may be also separated into segments (not shown).

In yet a further aspect, the present semiconductor packages may have a first die and a second die positioned on the top surface of the package substrate with at least a portion of the first die overlapping the first horizontal portion of the bridge frame and at least a portion of the second die overlapping the first horizontal portion of the bridge frame, wherein the overlapping portions of the first die and the second die, respectively, are coupled to at least one of the plurality of vertical interconnects. In addition, at the bottom surface of the package, a third die and a fourth die may be positioned with at least a portion of the third die overlapping the second horizontal portion of the bridge frame and at least a portion of the fourth die overlapping the second horizontal portion of the bridge frame, wherein the overlapping portions of the third die and the fourth die, respectively, are coupled to at least one of the plurality of vertical interconnects.

In another aspect, the semiconductor package of the present disclosure may include one or more first passive components positioned between first and second dies on the top surface of the package substrate. The first passive component may be coupled to the first and second dies through a first redistribution layer on a bridge frame. In addition, the semiconductor package may include one or more second passive components positioned between the third and fourth dies at the bottom surface of the package substrate. The second passive component may be coupled to the third and fourth dies through a second redistribution layer on the bridge frame.

In an addition aspect, the package substrate of the present semiconductor packages may have a substrate core layer with a first metallization layer on a top surface of the substrate core layer and a second metallization layer on a bottom surface of the substrate core layer, which may provide improved warpage control.

The technical advantages of the present disclosure include, but are not limited to, further package miniaturization, improved signal integrity, and improved power integrity. In particular, the present disclosure may provide package miniaturization through the double-sided placement of silicon dies/devices and other components, i.e., placement on opposing surfaces of a package substrate, with an integrated bridge frame that allows for compact multi-chip packages with reduces package footprints and reduced substrate routing layer counts.

In another aspect, the present semiconductor package may provide improved signal integrity through reduced signal latency between CPU/GPU/SOC and DRAM memory devices through shorter interconnects and less distorted signal transmission with enhanced return current path, i.e., direct top-to-bottom vertical interconnection, which minimizes lateral transmission path, as compared to the placement of DRAM devices adjacent or lateral to SOC/CPU/GPU dies and/or conventional PCB routing.

In addition, the present semiconductor package may provide improved system power integrity through a smaller AC power loop inductance by placing devices in close proximity with and direct coupling to power delivery decoupling capacitor(s) and the use of continuous or solid power (Vcc) rail and ground (Vss) network between vertical portions of a molded omni-directional bridge frame that provides shorter AC loop inductance, as well as reduced power delivery network (PDN) impedance peak and power supply noise induced jitter.

To more readily understand and put into practical effect the present semiconductor package, particular aspects will now be described by way of examples of different aspects that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

In the aspect shown in FIG. 1, according to an aspect of the present disclosure, a vertical cross-section view along the A-A' line of a semiconductor package (see FIG. 2) having a package substrate with an integrated bridge frame is provided. In addition, FIG. 1A shows an expanded view of an area of the semiconductor package shown in FIG. 1.

In this aspect, the semiconductor package 100 includes a package substrate 101 with an integrated bridge frame 102 formed in the package substrate 101. The package substrate 101 may include a top surface 101a and a bottom surface 101b and conventional laminated portions having metallization layers, interconnects, and contact pads. The bridge frame 102 includes molded horizontal portions that "bridge" or overlay the top surface 101a and the bottom surface 101b of the substrate. A molded first horizontal portion 103 of the bridge frame 102 may be positioned on the top surface 101a and a molded second horizontal portion 104 of the bridge frame 102 may be positioned at the bottom surface 101b of the package substrate 101. As shown in FIG. 1, a molded first vertical portion 105 and a molded second vertical portion 106 may be positioned between the first and second horizontal portions 103 and 104.

It is within the scope of the present disclosure to provide a bridge frame with one or several molded vertical portions between the horizontal portions of the bridge frame. In addition, a molded vertical portion may be vertically segmented (i.e., divided into sections) to accommodate metallization layers in a package substrate.

In another aspect, the bridge frame 102 may include a plurality of vertical interconnects 107, 108, 109, and 110 that may be positioned adjacent to the first and second vertical portions 105 and 106. The vertical interconnects 107, 108, 109, and 110 may have flange portions, e.g., contact pads that overlay the top and bottom surfaces 101a and 101b. In an aspect, a vertical metal plane 111 may be formed in the first vertical portion 105, which may separate the vertical portion 105 into two segments 105a and 105b. The vertical metal plane 111 may have a width in the range of approximately 10 μm to 100 μm and may be associated with a ground reference voltage (Vss) or a power supply reference voltage (Vcc) to facilitate signal current return path and/or power delivery. In another aspect, the vertical metal plane 111 maybe a shield layer for the vertical interconnects.

Figure 4:
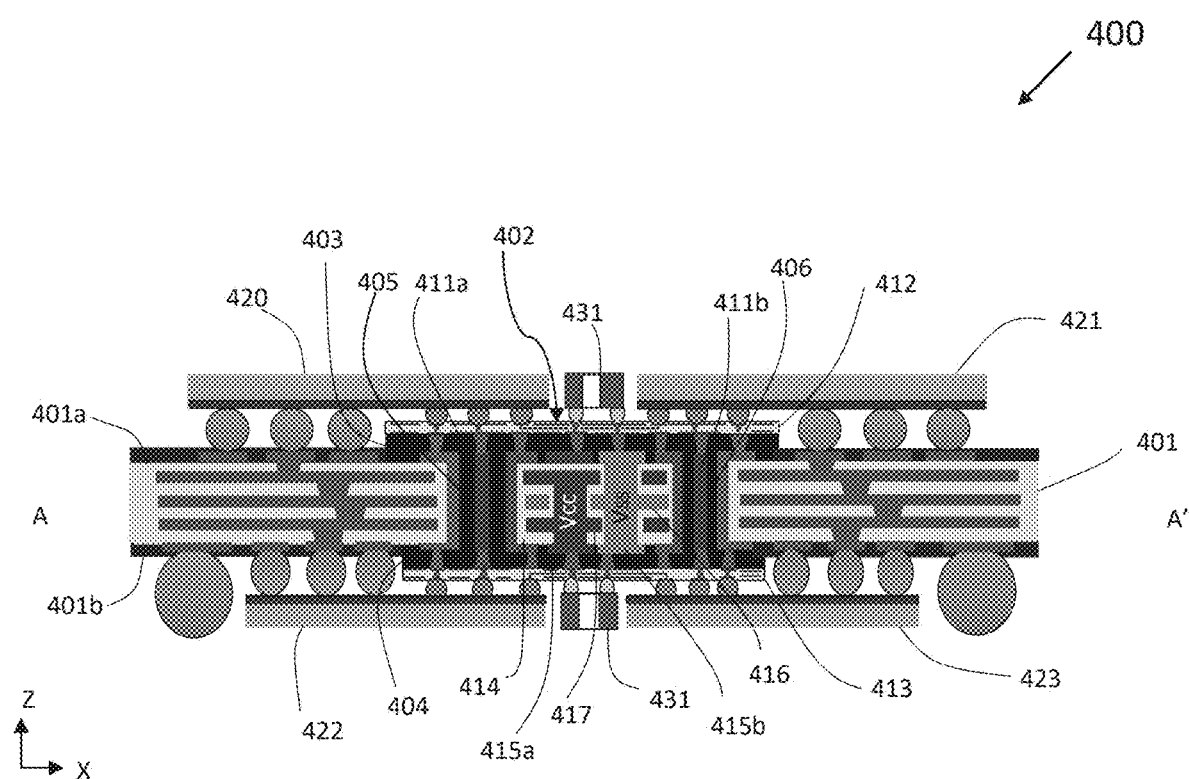
FIG. 4 shows a vertical cross-section view along the A-A' line of a semiconductor package having a package substrate with an integrated bridge frame according to another aspect of the present disclosure.

Within the scope of the present disclosure, there may be additional vertical interconnects positioned along the width of a bridge frame, as shown in FIG. 3A, and additional metal planes, e.g., one metal plane in each vertical portion, as shown in FIG. 4, or more than one metal plane in each vertical portion of a bridge frame (not shown).

In another aspect, a portion of the package substrate 114 may be positioned between the first and second vertical portions 105 and 106. The portion of the package substrate 114 may include a PTH via 115, a power plane 117, which may be connected to the PTH via 115, and a ground reference plane 116, which may be separated from the PTH via 115, for power delivery. In an aspect, for a PTH via, there may be generally three types—a first to facilitate power delivery, a second to facilitate ground reference or current return path, and a third to facilitate electrical signal transmission. In an aspect, the PTH via 115 may include a first geometry, e.g., a first volume and/or a first spacing between two adjacent PTH vias. In an aspect, the vertical interconnects 107, 108, 109, and 110 may include a second geometry e.g., a second volume and/or a second spacing between two adjacent vertical interconnects that is less than the first geometry.

In another aspect, a vertical interconnect may be comparably smaller in geometry than a PTH via, e.g. smaller in width and/or pitch by 0.25× to 0.75×. As discussed with regard to FIGS. 5A and 5B, a vertical interconnect may be formed by removing a portion of a PTH via as part of a process scheme for the present semiconductor packages.

In an aspect, the bridge frame 102 may include a first redistribution or metal build-up layer 112 positioned on the first horizontal portion 103 of the bridge frame 102 and a second redistribution or metal build-up layer 113 positioned on the second horizontal portion 104 of the bridge frame 102. In this aspect, the first redistribution layer 112 may provide electrical connections with devices positioned on the first horizontal portion 103 of the bridge frame 102 and on the bottom surface of the package substrate via a plurality of bridge vias 118 formed in the first horizontal portion 103, while the second redistribution layer 113 may provide electrical connections with devices positioned at the second horizontal portion 104 of the bridge frame 102 and connections with a plurality of bridge vias 119 formed in the second horizontal portion 104. In particular, the first and second redistribution layers may include at least one signal routing layer to facilitate signal transmission and at least one voltage reference plane, e.g., a ground voltage (Vss) reference plane and/or a power supply (Vcc) reference plane, to facilitate signal return path and/or power delivery.

In an aspect, a bridge frame may have horizontal and vertical portions made of a molded material according to the present disclosure. The molded material may provide a selected rigidity, along with a degree of flexibility, and may be formed of organic materials such as an epoxy resin polymer with encapsulated silica or nano-particle fillers, silicone polymer, or polyimide materials. In another aspect, the mold material may provide a selected flexibility, along with a degree of rigidity, and maybe form of organic materials such as elastic polymers, polyethylene, or other elastomers.

As further shown in FIG. 1, the semiconductor package 100 may have a first device or die 120 and a second device or die 121, which may include, for example, a central processing unit (CPU), a graphic processing unit (GPU), a platform controller hub (PCH) chipset, system on a chip and/or other processor devices. In this aspect, the first device 120 and the second device 121 may be partially disposed on the first redistribution layer 112, which may provide electrical connections with the vertical interconnects 107, 108, 109, and 110, and partly disposed on the top surface 101a of the package substrate 101.

Also shown in FIG. 1, the semiconductor package 100 may have a third device or die 122 and a fourth device or die 123, which may include, for example, a DRAM package, a plurality of DRAM dies, and/or other memory devices. In this aspect, the third device 122 and the fourth device 123 may be partially disposed on the second redistribution layer 113, which may provide electrical connections with the vertical interconnects 107, 108, 109, and 110, and partly disposed at the bottom surface 101b of the package substrate 101.

In a further aspect, the metal plane 111 may be connected to a power supply reference voltage (Vcc) to facilitate power delivery between the first and second devices 120 and 121 disposed on the top surface 101a of the package substrate 101 and the third and fourth devices 122 and 123 disposed on the bottom surface 101b of the package substrate 101. The vertical metal plane 111 may be configured with a 1.0V, 1.5V, 1.8V, or 3.3V power supply.

In an aspect, for 2.5D and 3D package (i.e., z-height), a first height from a top surface of the package substrate to a top surface of the thicker of either a first or second device may be in the range of approximately 50 μm to 800 μm. In another aspect, a second height from a bottom surface of a package substrate to a top surface of the thicker of either a third or fourth device may be in the range of approximately 50 μm to 800 μm.

In FIG. 1A, an expanded view of an area of the semiconductor package 100 shows a routing trace 130 in the first redistribution layer 112 that connects the first device 120 with the second device 121. It should be understood that a plurality of routing traces may connect the first device 120 with the second device 121 and equivalent routing traces may be present in the second redistribution layer 113 that connect the third device 122 and the fourth device 123 according to the present disclosure.

In addition, the first device 120, the second device 121, the third device 122, and fourth device 123, respectively, may have a metallization layer 124. In an aspect, the metallization layers 124 may have a plurality of micro-bumps 126 for coupling the first device 120 and the second device 121 with the first redistribution layer 112, and a plurality of micro-bumps 126 for coupling the third device 122 and fourth device 123 with the second redistribution layer 113.

In another aspect, the metallization layers 124 may have a plurality of package bumps 127 for coupling the first device 120 and the second device 121 with the top surface 101a of the package substrate 101, and a plurality of package bumps 127 for coupling the third device 122 and fourth device 123 with the bottom surface 101b of the package substrate 101. In a further aspect, the package bumps 127 may be coupled to contact pads 125 formed on the top surface 101a and bottom surface 101b of the package substrate 101, which may be separated by solder resist layers 129 formed on the top and bottom surfaces.

In yet another aspect, the semiconductor package may include a plurality of solder balls 128, i.e., a ball grid array (BGA), which will be large enough to provide clearance for the third and fourth devices 122 and 123, for coupling of the package substrate 101 to a printed circuit board (not shown). In a further aspect, a z-height from a bottom surface of a package substrate to a top surface of the thicker of either the third or fourth device may be in the range of approximately 100 μm to 500 μm to accommodate the stand-off height of the BGA.

Figure 2A:
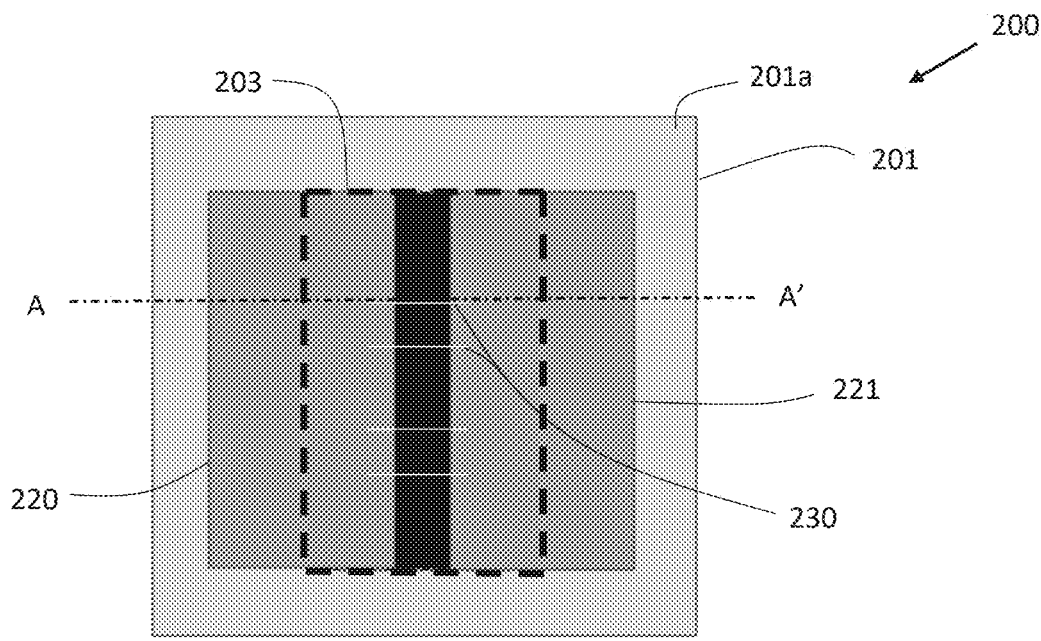
FIG. 2A shows a top view layout of a semiconductor package having a package substrate with an integrated bridge frame according to another aspect of the present disclosure.
Figure 2B:
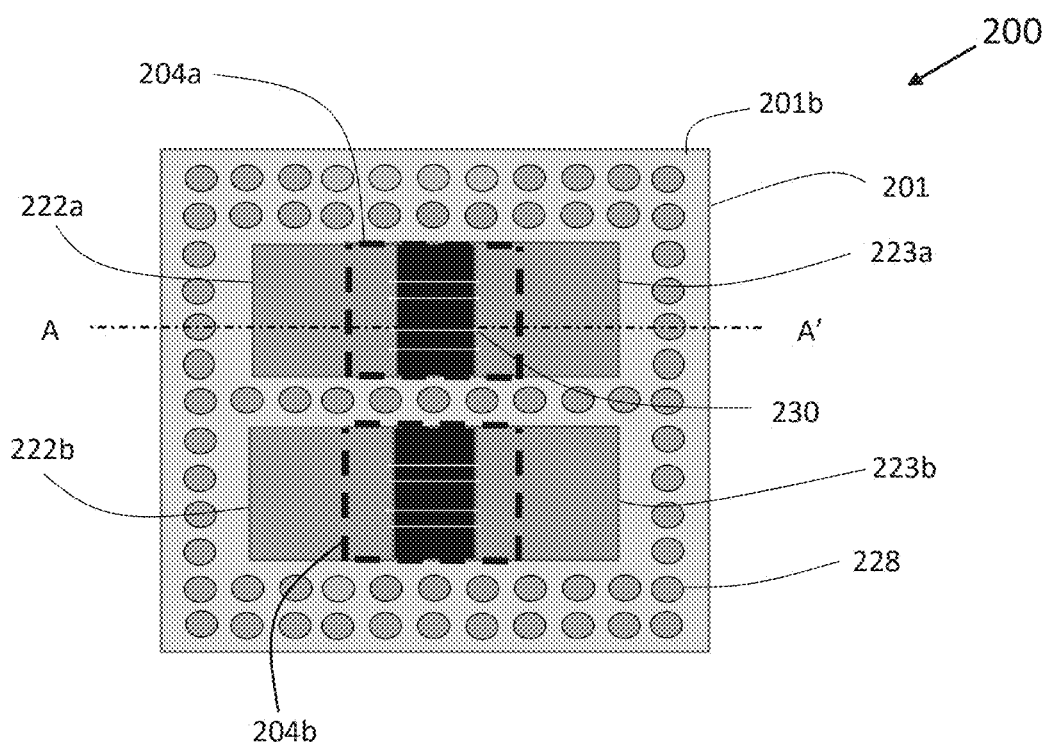
FIG. 2B shows a bottom view layout of a semiconductor package having a package substrate with an integrated bridge frame according to another aspect of the present disclosure.

FIG. 2A shows a top view layout of a semiconductor package 200 having a package substrate 201 with an integrated bridge frame, which is shown by dashed lines representing a footprint of its first horizontal portion 203, according to an aspect of the present disclosure. It is within the scope of the present disclosure to have a first horizontal portion of a bridge frame formed as one or more segments based on the design layout of a particular semiconductor package. In this aspect, a first device 220 and a second device 221 may be position on a top surface 201a of the package substrate 201. As shown in FIG. 2A, the first device 220 and the second device 221 may overlap the first horizontal portion 203 and may be electrically connected by a plurality of routing traces 230 of a first redistribution layer (not shown).

FIG. 2B shows a bottom view layout of the semiconductor package 200 having the package substrate 201 with an integrated bridge frame, which is shown by dashed lines representing a footprint of its second horizontal portion, which has a first segment 204a and a second segment 204b, according to an aspect of the present disclosure. It is within the scope of the present disclosure to have a second horizontal portion as a single body or several segments based on the design layout of a semiconductor package. In this aspect, a third device 222a, a fourth device 223a, a fifth device 222b and a sixth device 223b may be position at a bottom surface 201b of the package substrate 201.

As also shown in FIG. 2B, the third device 222a and the fourth device 223a may overlap the first segment 204a of a second horizontal portion and may be electrically connected by a plurality of routing traces 230 in a first segment of a second redistribution layer (not shown), and the fifth device 222b and the sixth device 223b may overlap the second segment 204b of the second horizontal portion and may be electrically connected by a plurality of routing traces 230 in a second segment of the second redistribution layer (not shown).

In an aspect, a third device may be a first memory device and a fourth device may be a first neural network accelerator device that may be disposed at a bottom surface of a package substrate. In another aspect, a fifth device may be a second neural network accelerator device and a sixth device may be a second memory device. In yet another aspect, the third device, fourth device, fifth device, and sixth device may be coupled through a second redistribution layer or segments thereof. In a further aspect, the third device and the fifth device may be coupled to a first device on a top surface of a package substrate through one or more of a plurality of vertical interconnects and/or vertical planes extending through the package substrate.

As shown in FIGS. 2A and 2B, the footprint of the first horizontal portion 203 of the bridge frame is larger than the combined footprints of the first and second segments 204a and 204b, respectively, of the second horizontal portion of the bridge frame. It is within the scope of the present disclosure to have a footprint of a first horizontal portion of a bridge frame be smaller than a footprint of a second horizontal portion of the bridge frame. In addition, a first horizontal portion of a bridge frame may be formed as one or more segments based on the design layout of a particular semiconductor package.

In an aspect, a footprint of a first horizontal portion of a bridge frame may have a dimension in the range of approximately 2 mm×2 mm to 5 mm×5 mm. In an aspect, the footprint of the first horizontal portion of the bridge frame may have a dimension in the range of approximately 1 mm×5 mm to 3 mm×15 mm. In another aspect, a footprint of a second horizontal portion of a bridge frame may have a dimension in the range of approximately 1 mm×1 mm to 3 mm×3 mm, which may be less than a footprint of a first horizontal portion, to accommodate and provide real-estate for a plurality of solder ball grid array (BGA) for package-to-motherboard interconnects. In an aspect, the footprints for the first and second horizontal portions may be smaller to accommodate functionality requirements or larger to provide greater mechanical strength for a package substrate.

According to an aspect of the present disclosure, FIG. 3 shows a vertical cross-section view along the A-A' line of a semiconductor package 300 having a package substrate 301 with an integrated bridge frame 302 and, in FIG. 3A, a horizontal cross-section view along the B-B' line of the semiconductor package shown in FIG. 3 is provided.

As shown in FIG. 3A, the package substrate 301 may include a portion 314 of the package substrate 301 between a first vertical portion 305 and a second vertical portion 306 of the bridge frame 302. In an aspect, a plurality of vertical interconnects 307a, 307b, 308a, and 308b may be disposed adjacent to the first vertical portion 305, and a plurality of vertical interconnects 309a, 309b, 310a, and 310b may be disposed adjacent to the second vertical portion 306 in the package substrate 301. In another aspect, a plurality of plated through-hole vias 315 may be disposed in the portion 314 of the package substrate 301 and spaced apart from a reference ground plane 316. In an aspect, the vertical portions 305 and 306 of the bridge frame may be parallel structures, as shown in FIG. 3A, or may be structures having shapes that partially or fully encircle or surround the portion 314 of the package substrate.

In an aspect, the first vertical portion 305 may have an embedded vertical metal plane 311 that forms segments 305a and 305b from the first vertical portion 305. In an aspect, one or more vertical metal planes may be spaced apart asymmetrically between adjacent vertical interconnects. In FIG. 3A, the placement of the embedded metal plane 311 may, for example, result in a first spacing ($S_1$) in the approximate range of 50 μm to 100 μm to facilitate a differential pair signal (D+) and (D−) (e.g., a Serializer and Deserializer (SerDes) interface, an Ulta Path Interconnect (UPI) interface, a high-speed Universal Serial Bus Gen 3.1 (USB3.1) or Peripheral Component Interface Express Gen 5 (PCIe5)) for the vertical interconnects 307a and 307b, and a second spacing ($S_2$) in the approximate range of 20 μm to 50 μm to facilitate a plurality of single-ended signals (D) (e.g., a double data-rate (DDR) memory or general-purpose input-output (GPIO)) for the vertical interconnects 308a and 308b. The first and second spacings $S_1$ and $S_2$ may be used to provide improved impedance control according to the present disclosure.

As shown in FIG. 4, a semiconductor package 400 may have a package substrate 401 with an integrated bridge frame 402, with similar structures as the semiconductor package 100 above, according to another aspect of the present disclosure.

In an aspect, the bridge frame 402 may have a molded first horizontal portion 403 positioned on a top surface 401a and a molded second horizontal portion 404 at a bottom surface 401b of the package substrate 401. As shown in FIG. 4, a molded first vertical portion 405 and a molded second vertical portion 406 may be positioned between the first and second horizontal portions 403 and 404.

In another aspect, a first vertical metal plane 411a may be formed in the first vertical portion 405 and a second vertical metal plane 411b may be formed in the second vertical portion 406. In another aspect, the vertical metal planes 411a and 411b may be shield layers for the adjacent vertical interconnects. In another aspect, the vertical metal planes 411a and 411b may be configured to a reference voltage e.g., a ground reference voltage (Vss) to facilitate signal current return path for the adjacent vertical interconnects or a power supply reference voltage (Vcc) to facilitate power delivery.

In FIG. 4, the semiconductor package 400 may have a first device 420 and a second device 421, which may include, for example, a central processing unit (CPU), a graphic processing unit (GPU), a platform controller hub (PCH) chipset, a system on a chip and/or other processor devices. In this aspect, the first device 420 and the second device 421 may be partially disposed on the first redistribution layer 412 and partly disposed on the top surface 401a of the package substrate 401.

Also shown in FIG. 4, the semiconductor package 400 may have a third device 422 and a fourth device 423, which may include, for example, a DRAM package, a plurality of DRAM dies, and/or other memory devices. In this aspect, the third device 422 and the fourth device 423 may be partially disposed on the second redistribution layer 413 and partly disposed at the bottom surface 401b of the package substrate 401.

In another aspect, a portion of the package substrate 414 may be positioned between the first and second vertical portions 405 and 406. The portion of the package substrate 414 may include embedded PTH vias 415a (Vcc) and 415b (Vss) connected to a power plane 417 and ground reference plane 416, respectively, to facilitate power delivery. In an aspect, the power delivery AC loop inductance may be reduced by having a continuous and/or localized power delivery network between the first and second vertical portions 405 and 406.

In a further aspect, passive components 431 may be disposed between the first and second devices 420 and 421 and between the third and fourth devices 422 and 423. The passive components 431 may improve device power delivery and integrity of a present semiconductor package. In an aspect, one or more passive components may be a multi-layer ceramic capacitor (MLCC) or silicon capacitor that may be coupled to at least one of the first and second redistribution layers to facilitate power delivery among the first, second, third, fourth, fifth and sixth devices, as well as other devices, of the present semiconductor package. In an aspect, the one or more MLCC or other passive components 431 may be coupled to the portion 414 of the package substrate 401 and/or the vertical metal planes 411a and 411b through at least one of the first and second redistribution layers 403 and 404 to facilitate power delivery among the first device 420, second device 421, third device 422, and/or fourth device 423, as well as other devices (not shown), of the present semiconductor package 400.

The present disclosure generally further relates to a method of forming a semiconductor package that may have operations for forming a package substrate with top and bottom surfaces having a plurality of vertical interconnects in the package substrate extending between the top and bottom surfaces of the package substrate and forming an integrated bridge frame in the package substrate that includes a first horizontal portion of the bridge frame positioned on the top surface of the package substrate over the plurality of vertical interconnects and PTH vias, a second horizontal portion of the bridge frame positioned at the bottom surface of the package substrate under the plurality of vertical interconnects and PTH vias, and a vertical portion of the bridge frame adjacent to the plurality of vertical interconnects connecting the first and second horizontal portions of the bridge frame.

In a further aspect, the method includes positioning a first die and a second die on the top surface of the package substrate with at least portions of the first and second dies overlap the first horizontal portion of the bridge frame, for which the overlapping portions of the first and second dies, respectively, are coupled to at least one of the plurality of vertical interconnects, and positioning a third die and a fourth die on the bottom surface of the package substrate with at least portions of the third and fourth dies overlap the second horizontal portion of the bridge frame, for which the overlapping portions of the third and fourth dies, respectively, are coupled to at least one of the plurality of vertical interconnects.

To more readily understand and put into practical effect the method of forming the present semiconductor package, particular aspects will now be described by way of examples that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

FIGS. 5A through 5I show vertical cross-sectional views directed to an exemplary process flow for making a semiconductor package 500 having a package substrate 501 with an integrated bridge frame 502 according to aspects of the present disclosure. The semiconductor package 500 is comparable to and has similar structures shown in the semiconductor package 100 disclosed above.

Figure 5A:
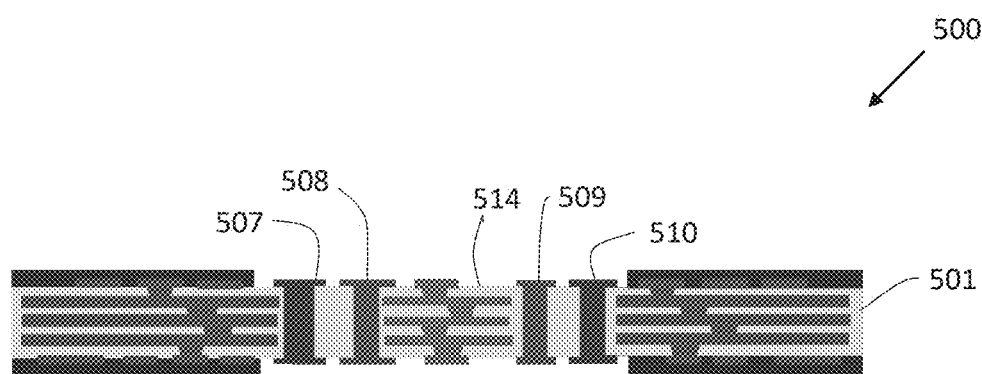

In FIG. 5A, according to a further aspect in forming the semiconductor package 500, a package substrate 501 may be formed using convention lamination, drilling, electroplating, and etching process steps, and plated through-hole (PTH) vias 507, 508, 509, and 510 may be formed of a conductive metal using conventional drilling, i.e., mechanical drilling, and metal plating/deposition process steps, e.g., copper deposition by an electroless and/or an electrolytic plating process. The formation of the PTH vias 508 and 509 results in a portion 514 of the package substrate 501 being disposed therebetween, which may have metallization layers or additional PTH vias formed therein.

Figure 5B:
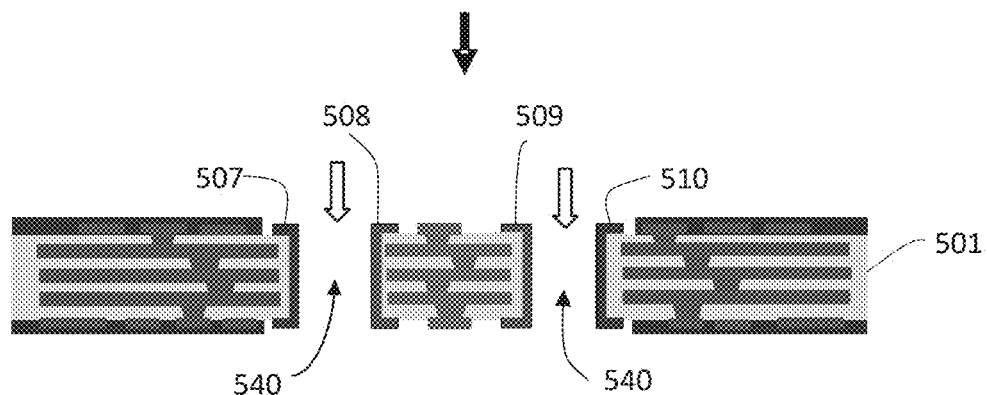

In FIG. 5B, according to a further aspect in forming the semiconductor package 500, openings 540 for disposing vertical portions of the bridge frame 502 may be formed by a drilling processing step, e.g., laser or mechanical drilling, that removes portions of the package substrate 501 and portions of the PTH vias 507, 508, 509, and 510, with the remaining portions becoming the vertical interconnects 507, 508, 509, and 510.

Figure 5C:
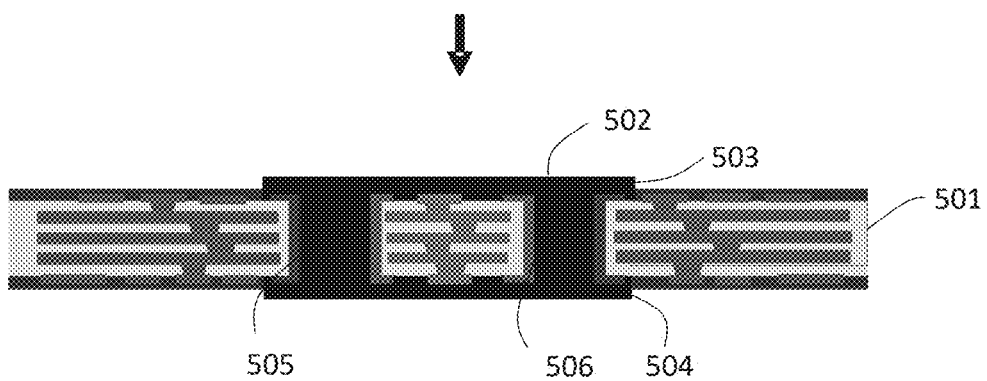

In FIG. 5C, according to a further aspect in forming the semiconductor package 500, the molded portions of bridge frame 502, i.e., the first and second horizontal portions 503 and 504 and the vertical portions 505 and 506 that extend therebetween, may be formed to bridge the surfaces of the package substrate 501 by molding process steps, e.g., compression molding, transfer molding and/or injection molding. The molded material may be selected to provide rigidity, along with a degree of flexibility, and maybe materials such as epoxy resin polymer, epoxy resin polymer with encapsulated silica or nano-particle fillers, silicone polymer, and/or polyimide materials.

In FIG. 5D, according to a further aspect in forming the semiconductor package 500, an opening 543 may be formed in the first vertical portion 505, a plurality of via openings 541 may be formed in the first horizontal portion 503, and a plurality of via openings 542 may be formed in the second horizontal portion 504 of the bridge frame 502 by a drilling processing step, e.g., laser or mechanical drilling, that selectively removes portions of the molded material.

In FIG. 5E, according to a further aspect in forming the semiconductor package 500, a metal plane 511 may be formed in the opening 543 in the first vertical portion 505, a plurality of bridge vias 518 may be formed in the via openings 541 in the first horizontal portion 503, and a plurality of bridge vias 519 may be formed in the via opening 542 in the second horizontal portion 504 of the bridge frame 502 by conventional metal plating/deposition process steps, e.g., copper deposition by an electroless and/or an electrolytic plating process.

According to the present disclosure, for the formation of the bridge vias and metal planes of conductive material herein, the choice between an electroless and electrolytic process may be based on the electroless process not requiring the application of an external electrical current to drive the deposition, whereas the electrolytic process does. In addition, an electroless process uses a chemical reducing agent within its solution chemistry which will result in nearly uniform deposition on all surfaces that are wetted by the chemistry.

In FIG. 5F, according to a further aspect in forming the semiconductor package 500, a first redistribution layer 512 may be formed on the first horizontal portion 503, and a second redistribution layer 513 may be formed on the second horizontal portion 504 of the bridge frame 502 by using convention lamination processing steps, i.e., photolithography, etching, and metal plating/deposition (e.g., copper deposition by an electroless and/or an electrolytic plating process). During the process, the first redistribution layer 512 may be coupled to the plurality of bridge vias 518 and the second redistribution layer 513 may be coupled to the plurality of bridge vias 519.

Figure 5G:
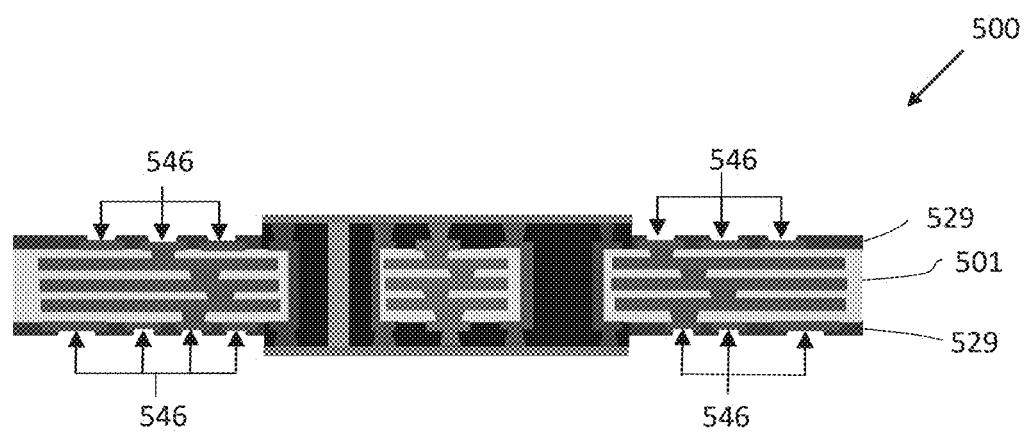

In FIG. 5G, according to a further aspect in forming the semiconductor package 500, openings 546 may be formed in top and bottom solder resist layers 529 to expose portions of contact pads formed in the package substrate 501. The top and bottom openings 546 may be formed by a photolithography process, e.g., an ultra-violet (UV) photoresist development and wet etching. It is also possible to use reactive ion etching to form the openings.

Figure 5H:
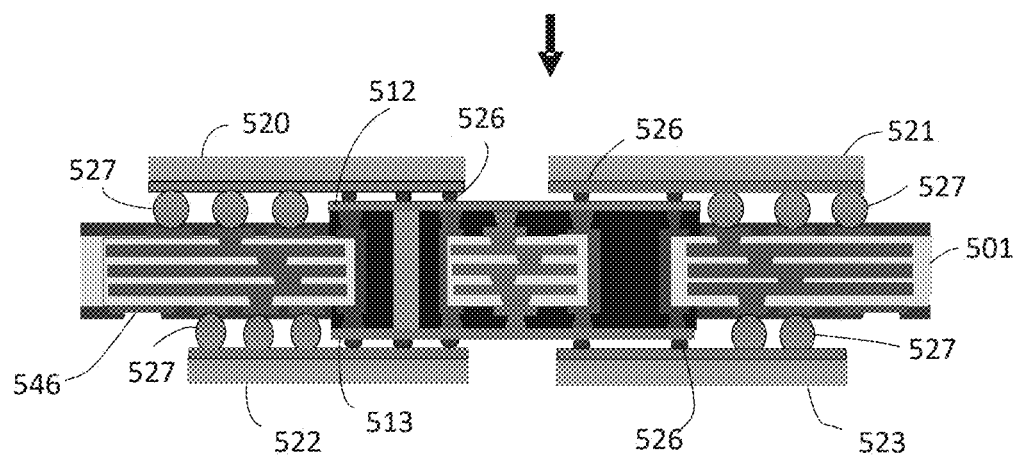

In FIG. 5H, according to a further aspect in forming the semiconductor package 500, a first device 520, a second device 521, a third device 522, and a fourth device 523 may be attached to the package substrate 501. The first, second, third, and fourth devices may have a plurality of package bumps 527 that are aligned with and positioned in the openings 546 (shown in FIG. 5G), and a plurality of microbumps 526 that are aligned with and positioned on contact pads (not shown) on the first and second redistribution layers 512 and 513. The coupling of the first, second, third, and fourth devices may use conventional methods, including solder bonding, thermal compression bonding, or other surface mounting methods.

Figure 5I:
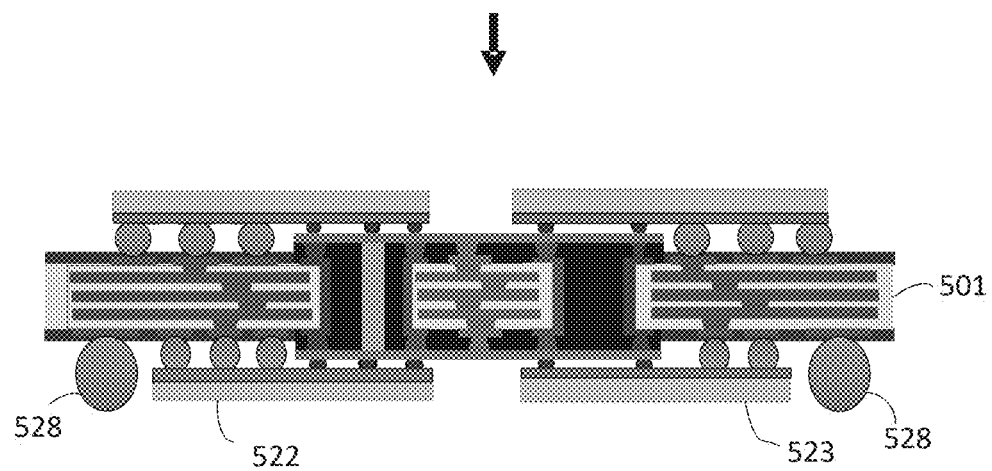

In FIG. 5I, according to a further aspect in forming the semiconductor package 500, the package substrate 501 is provided with a plurality of solder balls 528 that are positioned in the openings 546 (shown in FIG. 5H), which will be large enough to provide clearance for the third and fourth chips 522 and 523, respectively, for coupling the package substrate to a printed circuit board (not shown). The coupling of the package substrate 501 to the printed circuit board may use conventional methods, including solder reflow, thermal compression bonding, or other surface mounting methods.

The representative layout figures above provide the approximate footprints for the various selected structures and features of the present semiconductor packages and their relative positions in the semiconductor packages may be situated on different levels thereof.

The fabrication methods and the choice of materials presented above are intended to be exemplary for forming the present semiconductor packages. It will be apparent to those ordinary skilled practitioners that the foregoing process operations may be modified without departing from the spirit of the present disclosure.

Figure 6:
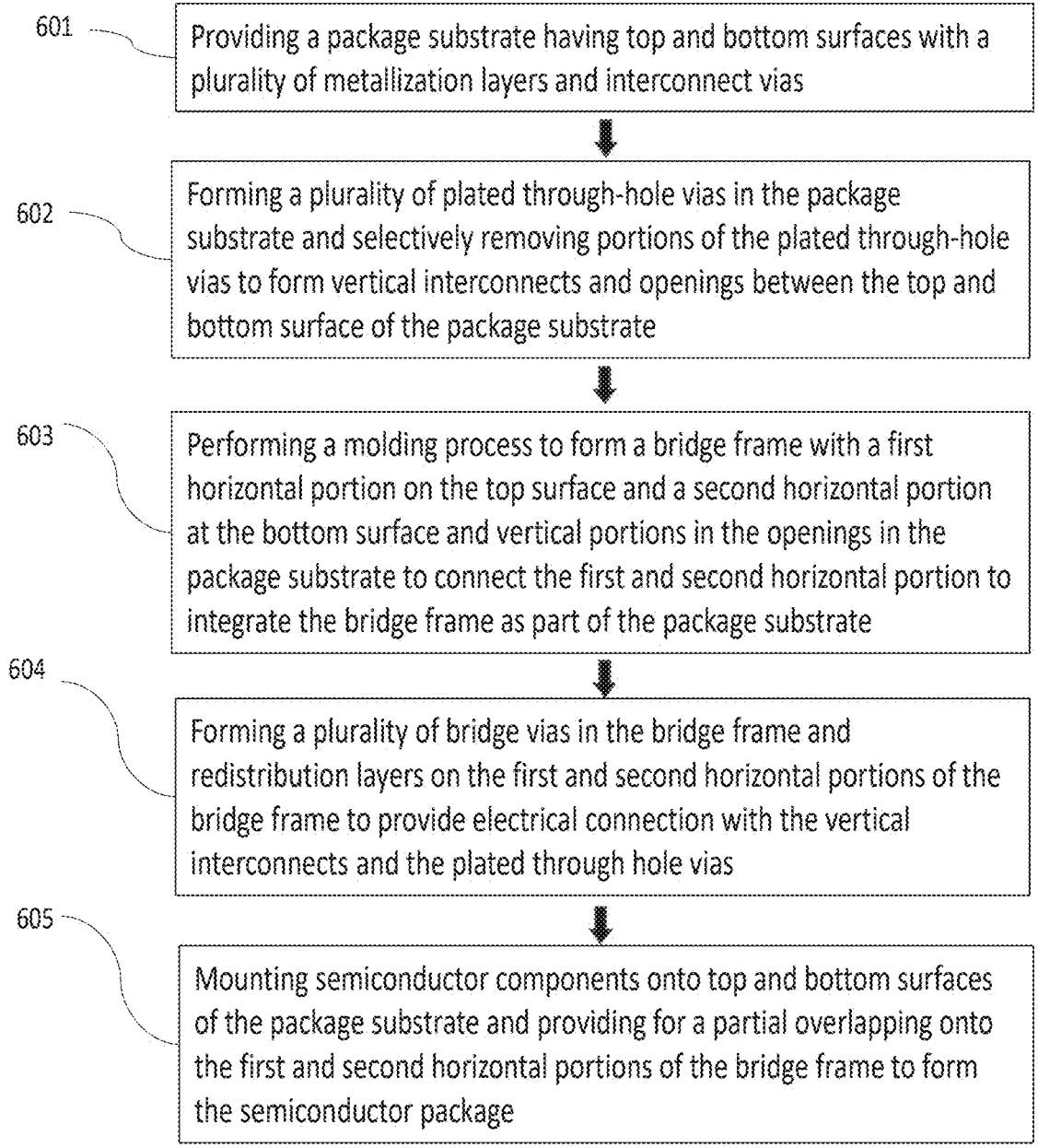
FIG. 6 shows a simplified flow diagram for an exemplary method according to aspects of the present disclosure encompassing the assembly process for a present semiconductor package.

FIG. 6 shows a simplified flow diagram for an exemplary method according to aspects of the present disclosure encompassing the assembly process for a present semiconductor package.

The operation 601 may be directed to providing a package substrate having top and bottom surfaces with a plurality of metallization layers and interconnect vias.

The operation 602 may be directed to forming a plurality of plated through-hole vias in the package substrate and selectively removing portions of the plated through-hole vias to form vertical interconnects and openings between the top and bottom surface of the package substrate.

The operation 603 may be directed to using a molding process to form a bridge frame with a first horizontal portion on the top surface and a second horizontal portion at the bottom surface and vertical portions in the openings in the package substrate to connect the first and second horizontal portion to integrate the bridge frame as part of the package substrate.

The operation 604 may be directed to forming a plurality of bridge vias in the bridge frame and redistribution layers on the first and second horizontal portions of the bridge frame to provide electrical connection with the vertical interconnects and the plated through hole vias.

The operation 605 may be directed to mounting semiconductor components onto top and bottom surfaces of the package substrate and providing for a partial overlapping onto the first and second horizontal portions of the bridge frame to form the semiconductor package.

Figure 7:
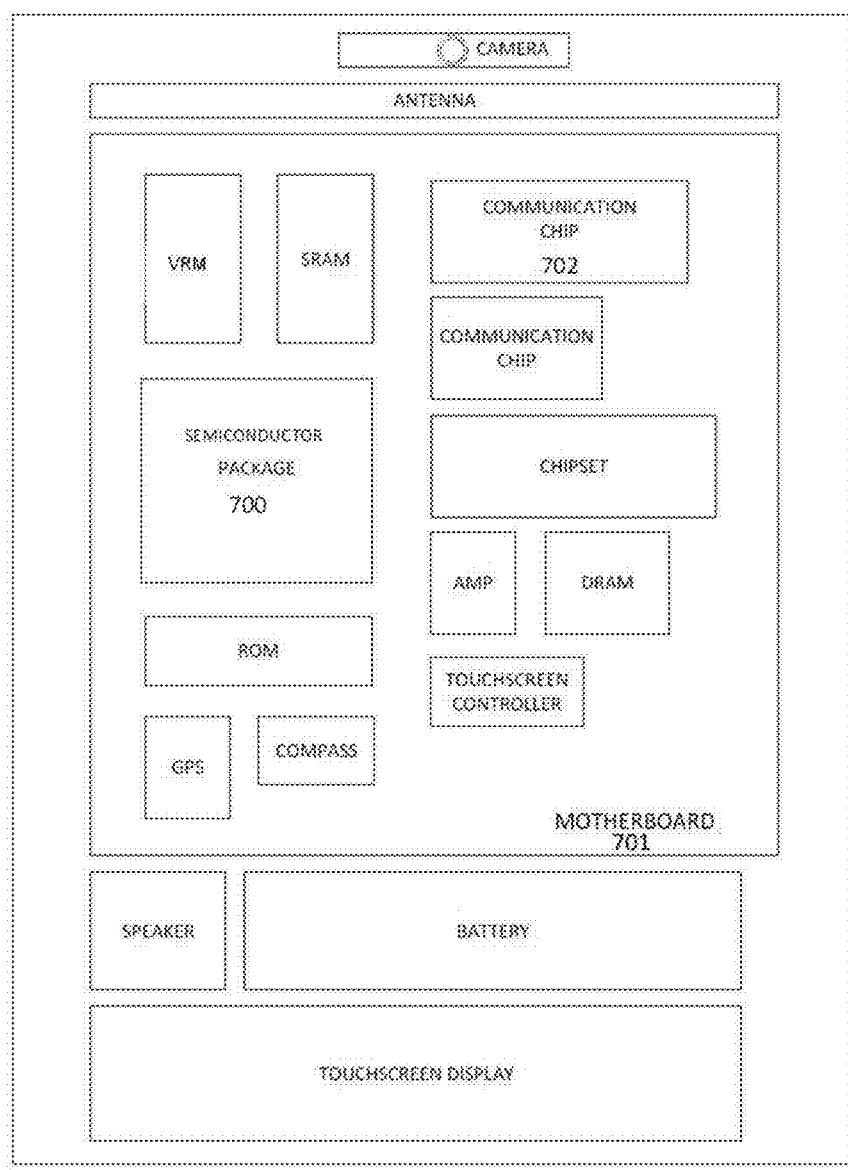
FIG. 7 shows an illustration of a computing device that includes a present semiconductor package according to a further aspect of the present disclosure.

In another aspect, the present disclosure may be implemented into a system using any suitable hardware and/or software. FIG. 7 schematically illustrates a computing device 70 that may include a semiconductor package 700 as described herein, in accordance with some aspects of the present disclosure.

According to the present disclosure, the computing device 70 may include a motherboard or printed circuit board 701, a semiconductor package 700, which has a package substrate with an integrated bridge frame having a first horizontal portion positioned on a top surface of the package substrate, with first and second dies positioned overlapping the first horizontal portion of the bridge frame, and a second horizontal portion positioned on the bottom surface of the package substrate, with third and fourth dies positioned overlapping the second horizontal portion of the bridge frame. The bridge frame further includes first and second vertical portions separated by a portion of the package substrate positioned under the first horizontal portion of the bridge frame between the top surface and bottom surfaces of the package substrate, and a plurality of vertical interconnects adjacent to the first and second vertical portions of the bridge frame.

In an aspect, the computing device 70 may house a board such as a motherboard 701. The motherboard 701 may include a number of components, including, but not limited to, a semiconductor package 700 and at least one communication chip 702. The semiconductor package according to the present disclosure, may be physically and electrically coupled to the motherboard 701. In some implementations, the at least one communication chip 702 may also be physically and electrically coupled to the motherboard 701. In further implementations, the communication chip 702 may be part of a semiconductor package.

Depending on its applications, computing device 70 may include other components that may or may not be physically and electrically coupled to the motherboard 701. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the semiconductor package 700 of the computing device 70 may include a semiconductor package 700 with an integrated bridge frame as described herein.

The communication chip 702 may enable wireless communications for the transfer of data to and from the computing device 70. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 702 may implement any of a number of wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2", etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 702 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 702 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 702 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 702 may operate in accordance with other wireless protocols in other aspects.

The computing device 70 may include a plurality of communication chips 702. For instance, a first communication chip 702 may be dedicated to shorter range wireless communications such as Wi-Fi and Bluetooth and a second communication chip 702 may be dedicated to longer range wireless communications such as GPS, EDGE, GPRS, CDMA, WiMAX, LTE, Ev-DO, and others.

In various implementations, the computing device 70 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 70 may be a mobile computing device. In further implementations, the computing device 70 may be any other electronic device that processes data. To more readily understand and put into practical effect the present method and device for, particular aspects will now be described by way of examples. For the sake of brevity, duplicate descriptions of features and properties may be omitted.

EXAMPLES

Example 1 provides a semiconductor package including a package substrate with an integrated bridge frame and a plurality of vertical interconnects, the bridge frame including a first horizontal portion of the bridge frame positioned on a top surface of the package substrate, a second horizontal portion of the bridge frame positioned at a bottom surface of the package substrate under the first horizontal portion of the bridge frame, and a vertical portion of the bridge frame positioned adjacent to the plurality of vertical interconnects, for which the vertical portion of the bridge frame and the plurality of vertical interconnects are positioned under the first horizontal portion the bridge frame between the top and bottom surfaces of the package substrate, and a first die and a second die positioned on the top surface of the package substrate with at least a portion of the first die overlapping the first horizontal portion of the bridge frame and at least a portion of the second die overlapping the first horizontal portion of the bridge frame, for which the overlapping portions of the first die and the second die, respectively, are coupled to at least one of the plurality of vertical interconnects.

Example 2 may include the semiconductor package of example 1 and/or any other example disclosed herein, further including a third die positioned at the bottom surface of the package substrate with at least a portion of the third die overlapping the second horizontal portion of the bridge frame, for which the overlapping portion of the third die is coupled to at least one of the plurality of vertical interconnects, and a fourth die positioned at the bottom surface of the package substrate with at least a portion of the fourth die overlapping the second horizontal portion of the bridge frame, for which the overlapping portion of the fourth die is coupled to at least one of the plurality of vertical interconnects.

Example 3 may include the semiconductor package of example 2 and/or any other example disclosed herein, for which the second horizontal portion of the bridge frame position at the bottom surface of the package substrate further comprises a first segment and a second segment, for which the third and fourth dies overlap the first segment of the second horizontal portion of the bridge frame, and a fifth die positioned at the bottom surface of the package substrate with at least a portion of the fifth die overlapping the second segment of the second horizontal portion of the bridge frame, for which the overlapping portion of the fifth die is coupled to at least one of the plurality of vertical interconnects, and a sixth die positioned at the bottom surface of the package substrate with at least a portion of the sixth die overlapping the second segment of the second horizontal portion of the bridge frame, for which the overlapping portion of the sixth die is coupled to at least one of the plurality of vertical interconnects.

Example 4 may include the semiconductor package of example 1 and/or any other example disclosed herein, for which the vertical portion of the bridge frame comprises a first vertical portion and a second vertical portion adjacent to the plurality of vertical interconnects, for which the first and second vertical portions are separated by a portion of the package substrate.

Example 5 may include the semiconductor package of example 1 and/or any other example disclosed herein, for which the first horizontal portion of the bridge frame further comprises a first redistribution layer, for which the overlapping portions of the first and second dies are coupled to the first redistribution layer and the first die is coupled to the second die via the first redistribution layer.

Example 6 may include the semiconductor package of example 5 and/or any other example disclosed herein, for which the second horizontal portion of the bridge frame further comprises a second redistribution layer, for which the overlapping portions of the third and fourth dies are coupled to the second redistribution layer, and the third die is coupled to the fourth die via the second redistribution layer.

Example 7 may include the semiconductor package of example 6 and/or any other example disclosed herein, for which the first redistribution layer is coupled to the plurality of vertical interconnects at the top surface of the package substrate through a plurality of first bridge vias, and the second metal redistribution layer is coupled to the plurality of vertical interconnects at the bottom surface of the package substrate through a plurality of second bridge vias.

Example 8 may include the semiconductor package of example 1 and/or any other example disclosed herein, further including a metal plane embedded in the vertical portion of the bridge frame.

Example 9 may include the semiconductor package of example 8 and/or any other example disclosed herein, for which the metal plane is asymmetrically spaced between adjacent vertical interconnects to provide impedance control.

Example 10 may include the semiconductor package of example 8 and/or any other example disclosed herein, for which the metal plane is coupled to a ground reference voltage (Vss) or a power supply reference voltage (Vcc), or is a shielding layer.

Example 11 may include the semiconductor package of example 4 and/or any other example disclosed herein, further including a first metal plane embedded in the first vertical portion of the bridge frame and a second metal plane embedded in the second vertical portion of the bridge frame.

Example 12 may include the semiconductor package of example 4 and/or any other example disclosed herein, for which the plurality of vertical interconnects further comprises a plurality of plated through-hole vias formed in the portion of the package substrate between the first and second vertical portions of the bridge frame, for which at least one of the plurality of plated through-hole vias is configured to facilitate power delivery and the vertical interconnects adjacent to the first and second vertical portions of the bridge frame are configured to facilitate signal transmissions.

Example 13 may include the semiconductor package of example 7 and/or any other example disclosed herein, further including a first passive component positioned between the first and second dies, for which the first passive component is coupled to the first and second dies through the first redistribution layer.

Example 14 may include the semiconductor package of example 13 and/or any other example disclosed herein, further including a second passive component positioned between the third and fourth dies, for which the second passive component is coupled to the third and fourth dies through the second redistribution layer.

Example 15 may include the semiconductor package of example 1 and/or any other example disclosed herein, for which a first footprint of the first horizontal portion of the bridge frame on the top surface of the package substrate and a second footprint of the second horizontal portion of the bridge frame on the bottom surface of the package substrate are adjustable to accommodate the space constraints relating to the placement of various components.

Example 16 may include the semiconductor package of example 1 and/or any other example disclosed herein, for which the first and second horizontal portions and the vertical portion of the bridge frame further comprise an organic molded epoxy material.

Example 17 provides a method including forming a semiconductor package including forming a package substrate with top and bottom surfaces, forming a plurality of vertical interconnects in the package substrate extending between the top surface and the bottom surface of the package substrate, and forming a bridge frame in the package substrate including a first horizontal portion of the bridge frame positioned on the top surface of the package substrate over the plurality of vertical interconnects, a second horizontal portion of the bridge frame positioned at the bottom surface of the package substrate under the plurality of vertical interconnects, and a vertical portion of the bridge frame adjacent to the plurality of vertical interconnects connecting the first and second horizontal portions of the bridge frame.

Example 18 may include the method of example 17 and/or any other example disclosed herein, for which forming the semiconductor package further comprises positioning a first die and a second die on the top surface of the package substrate with at least a portion of the first die overlapping the first horizontal portion of the bridge frame and at least a portion of the second die overlapping the first horizontal portion of the bridge frame, for which the overlapping portions of the first and second dies, respectively, are coupled to at least one of the plurality of vertical interconnects, and positioning a third die and a fourth die on the bottom surface of the package substrate with at least a portion of the third die overlapping the second horizontal portion of the bridge frame and at least a portion of the fourth die overlapping the second horizontal portion of the bridge frame, for which the overlapping portions of the third and fourth dies, respectively, are coupled to at least one of the plurality of vertical interconnects.

Example 19 provides a computing device including a semiconductor package including a package substrate with an integrated bridge frame, the bridge frame including a first horizontal portion positioned on a top surface of the package substrate, a second horizontal portion positioned at a bottom surface of the package substrate, and first and second vertical portions separated by a portion of the package substrate, the first and second vertical portions connecting the first and second horizontal portions of the bridge frame, and a plurality of vertical interconnects positioned under the first horizontal portion of the bridge frame between the top surface and the bottom surface of the package substrate, for which the plurality of vertical interconnects are adjacent to the first and second vertical portions of the bridge frame.

Example 20 may include the computing device of example 19 and/or any other example disclosed herein, for which the semiconductor package further comprises a first die positioned on the top surface of the package substrate with at least a portion of the first die overlapping the first horizontal portion of the bridge frame, a second die positioned on the top surface of the package substrate with at least a portion of the second die overlapping the first horizontal portion of the bridge frame, a third die positioned on the bottom surface of the package substrate with at least a portion of the third die overlapping the second horizontal portion of the bridge frame, and a fourth die positioned on the bottom surface of the package substrate with at least a portion of the fourth die overlapping the second horizontal portion of the bridge frame, for which the overlapping portions of the first, second, third, and fourth dies, respectively, are coupled to at least one of the plurality of vertical interconnects.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
a package substrate with an integrated bridge frame at least partially disposed in the package substrate and a plurality of vertical interconnects, the bridge frame comprising:
a first horizontal portion of the bridge frame positioned on a top surface of the package substrate, a second horizontal portion of the bridge frame positioned at a bottom surface of the package substrate under the first horizontal portion of the bridge frame, and a vertical portion of the bridge frame positioned adjacent to the plurality of vertical interconnects, wherein the vertical portion of the bridge frame and the plurality of vertical interconnects are positioned under the first horizontal portion of the bridge frame between the top and bottom surfaces of the package substrate, wherein a distance between a top surface of the first horizontal portion and a bottom surface of the second horizontal portion is greater than a distance between the top surface of the package substrate and the bottom surface of the package substrate; and
a first die and a second die positioned on the top surface of the package substrate with at least a portion of the first die overlapping the first horizontal portion of the bridge frame and at least a portion of the second die overlapping the first horizontal portion of the bridge frame, wherein the overlapping portions of the first die and the second die, respectively, are coupled to at least one of the plurality of vertical interconnects.

2. The semiconductor package of claim 1, further comprising:
a third die positioned at the bottom surface of the package substrate with at least a portion of the third die overlapping the second horizontal portion of the bridge frame, wherein the overlapping portion of the third die is coupled to at least one of the plurality of vertical interconnects; and
a fourth die positioned at the bottom surface of the package substrate with at least a portion of the fourth die overlapping the second horizontal portion of the bridge frame, wherein the overlapping portion of the fourth die is coupled to at least one of the plurality of vertical interconnects.

3. The semiconductor package of claim 2, wherein the second horizontal portion of the bridge frame positioned at the bottom surface of the package substrate further comprises:
a first segment and a second segment, wherein the third and fourth dies overlap the first segment of the second horizontal portion of the bridge frame;
a fifth die positioned at the bottom surface of the package substrate with at least a portion of the fifth die overlapping the second segment of the second horizontal portion of the bridge frame, wherein the overlapping portion of the fifth die is coupled to at least one of the plurality of vertical interconnects; and
a sixth die positioned at the bottom surface of the package substrate with at least a portion of the sixth die overlapping the second segment of the second horizontal portion of the bridge frame, wherein the overlapping portion of the sixth die is coupled to at least one of the plurality of vertical interconnects.

4. The semiconductor package of claim 1, wherein the vertical portion of the bridge frame comprises a first vertical portion and a second vertical portion adjacent to the plurality of vertical interconnects, wherein the first and second vertical portions are separated by a portion of the package substrate.

5. The semiconductor package of claim 4, further comprising a first metal plane embedded in the first vertical portion of the bridge frame and a second metal plane embedded in the second vertical portion of the bridge frame.

6. The semiconductor package of claim 4, wherein the plurality of vertical interconnects further comprise a plurality of plated through-hole vias formed in the portion of the package substrate between the first and second vertical portions of the bridge frame, wherein at least one of the plurality of plated through-hole vias is configured to facilitate power delivery and the vertical interconnects adjacent to the first and second vertical portions of the bridge frame are configured to facilitate signal transmissions.

7. The semiconductor package of claim 1, wherein the first horizontal portion of the bridge frame further comprises a first redistribution layer, wherein the overlapping portions of the first and second dies are coupled to the first redistribution layer and the first die is coupled to the second die via the first redistribution layer.

8. The semiconductor package of claim 7, further comprising:
a third die positioned at the bottom surface of the package substrate with at least a portion of the third die overlapping the second horizontal portion of the bridge frame, wherein the overlapping portion of the third die is coupled to at least one of the plurality of vertical interconnects; and
a fourth die positioned at the bottom surface of the package substrate with at least a portion of the fourth die overlapping the second horizontal portion of the bridge frame, wherein the overlapping portion of the fourth die is coupled to at least one of the plurality of vertical interconnects;
wherein the second horizontal portion of the bridge frame further comprises a second redistribution layer, wherein the overlapping portions of the third and fourth dies are coupled to the second redistribution layer, and the third die is coupled to the fourth die via the second redistribution layer.

9. The semiconductor package of claim 8, wherein the first redistribution layer is coupled to the plurality of vertical interconnects at the top surface of the package substrate through a plurality of first bridge vias, and the second redistribution layer is coupled to the plurality of vertical interconnects at the bottom surface of the package substrate through a plurality of second bridge vias.

10. The semiconductor package of claim 9, further comprising a first passive component positioned between the first and second dies, wherein the first passive component is coupled to the first and second dies through the first redistribution layer.

11. The semiconductor package of claim 10, further comprising a second passive component positioned between the third and fourth dies, wherein the second passive component is coupled to the third and fourth dies through the second redistribution layer.

12. The semiconductor package of claim 1, further comprising a metal plane embedded in the vertical portion of the bridge frame.

13. The semiconductor package of claim 12, wherein the metal plane is asymmetrically spaced between adjacent vertical interconnects to provide impedance control.

14. The semiconductor package of claim 12, wherein the metal plane is coupled to a ground reference voltage (Vss) or a power supply reference voltage (Vcc) or is a shielding layer.

15. The semiconductor package of claim 1, wherein a first footprint of the first horizontal portion of the bridge frame on the top surface of the package substrate has a dimension in the range of 1 millimeter by 5 millimeters to 3 millimeters by 15 millimeters, and wherein a second footprint of the second horizontal portion of the bridge frame on the bottom surface of the package substrate has a dimension in the range of 1 millimeter by 1 millimeter to 3 millimeters by 3 millimeters.

16. The semiconductor package of claim 1, wherein the first and second horizontal portions and the vertical portion of the bridge frame further comprise an organic molded epoxy material.

17. A computing device comprising:
a semiconductor package comprising:
a package substrate with an integrated bridge frame at least partially disposed in the package substrate, the bridge frame comprising a first horizontal portion positioned on a top surface of the package substrate, a second horizontal portion positioned at a bottom surface of the package substrate, and first and second vertical portions separated by a portion of the package substrate, the first and second vertical portions connecting the first and second horizontal portions of the bridge frame, wherein a distance between a top surface of the first horizontal portion and a bottom surface of the second horizontal portion is greater than a distance between the top surface of the package substrate and the bottom surface of the package substrate; and a plurality of vertical interconnects positioned under the first horizontal portion of the bridge frame between the top surface and the bottom surface of the package substrate, wherein the plurality of vertical interconnects are adjacent to the first and second vertical portions of the bridge frame.

18. The computing device of claim 17, wherein the semiconductor package further comprises:

a first die positioned on the top surface of the package substrate with at least a portion of the first die overlapping the first horizontal portion of the bridge frame;

a second die positioned on the top surface of the package substrate with at least a portion of the second die overlapping the first horizontal portion of the bridge frame;

a third die positioned on the bottom surface of the package substrate with at least a portion of the third die overlapping the second horizontal portion of the bridge frame; and a fourth die positioned on the bottom surface of the package substrate with at least a portion of the fourth die overlapping the second horizontal portion of the bridge frame, wherein the overlapping portions of the first, second, third, and fourth dies, respectively, are coupled to at least one of the plurality of vertical interconnects.

19. A method comprising:

forming a semiconductor package comprising:

forming a package substrate with top and bottom surfaces;

forming a plurality of vertical interconnects in the package substrate extending between the top surface and the bottom surface of the package substrate;

forming a bridge frame at least partially in the package substrate comprising a first horizontal portion of the bridge frame positioned on the top surface of the package substrate over the plurality of vertical interconnects, a second horizontal portion of the bridge frame positioned at the bottom surface of the package substrate under the plurality of vertical interconnects, and a vertical portion of the bridge frame adjacent to the plurality of vertical interconnects connecting the first and second horizontal portions of the bridge frame, wherein a distance between a top surface of the first horizontal portion and a bottom surface of the second horizontal portion is greater than a distance between the top surface of the package substrate and the bottom surface of the package substrate;

positioning a first die and a second die on the top surface of the package substrate with at least a portion of the first die overlapping the first horizontal portion of the bridge frame and at least a portion of the second die overlapping the first horizontal portion of the bridge frame, wherein the overlapping portions of the first and second dies, respectively, are coupled to at least one of the plurality of vertical interconnects; and positioning a third die and a fourth die on the bottom surface of the package substrate with at least a portion of the third die overlapping the second horizontal portion of the bridge frame and at least a portion of the fourth die overlapping the second horizontal portion of the bridge frame, wherein the overlapping portions of the third and fourth dies, respectively, are coupled to at least one of the plurality of vertical interconnects.

* * * * *